(12) United States Patent
Im

(10) Patent No.: US 9,570,391 B2
(45) Date of Patent: Feb. 14, 2017

(54) SEMICONDUCTOR DEVICE AND METHOD FOR MANUFACTURING THE SAME

(71) Applicant: SK hynix Inc., Icheon (KR)

(72) Inventor: Song Hyeuk Im, Cheongju (KR)

(73) Assignee: SK HYNIX INC., Icheon (KR)

( * ) Notice: Subject to any disclaimer, the term of this patent is extended or adjusted under 35 U.S.C. 154(b) by 2 days.

(21) Appl. No.: 14/684,278

(22) Filed: Apr. 10, 2015

(65) Prior Publication Data
US 2015/0214147 A1 Jul. 30, 2015

Related U.S. Application Data

(62) Division of application No. 13/607,628, filed on Sep. 7, 2012, now Pat. No. 9,034,745.

(30) Foreign Application Priority Data

Mar. 30, 2012 (KR) .......................... 10-2012-0033281

(51) Int. Cl.
H01L 21/28 (2006.01)
H01L 23/528 (2006.01)
H01L 27/108 (2006.01)
H01L 23/532 (2006.01)

(52) U.S. Cl.
CPC ....... *H01L 23/528* (2013.01); *H01L 23/53257* (2013.01); *H01L 23/53271* (2013.01); *H01L 27/10805* (2013.01); *H01L 27/10885* (2013.01); *H01L 27/10888* (2013.01); *H01L 2924/0002* (2013.01)

(58) Field of Classification Search
CPC ................... H01L 21/28518; H01L 21/28556; H01L 21/76843; H01L 21/76855; H01L 2924/01013; H01L 2924/01079; H01L 2924/01029; H01L 2924/01078; H01L 2924/14; H01L 21/28; H01L 21/28566; H01L 21/76
USPC .................................................. 257/770, 773
See application file for complete search history.

(56) References Cited

U.S. PATENT DOCUMENTS

| 5,565,708 | A | * | 10/1996 | Ohsaki et al. | ................ 257/764 |
| 6,670,268 | B2 | * | 12/2003 | Shin et al. | ..................... 438/637 |
| 2004/0058519 | A1 | * | 3/2004 | Wu | .................... H01L 21/76843 438/597 |
| 2012/0217576 | A1 | * | 8/2012 | Yeo | ................... H01L 27/10855 257/330 |

* cited by examiner

*Primary Examiner* — Monica D Harrison

(57) ABSTRACT

A semiconductor device and a method for manufacturing the same are disclosed. A semiconductor device includes a contact hole formed over a semiconductor substrate so as to open an active region, a contact plug coupled to the active region in the contact hole and having a height lower than that of the contact hole, and a bit line that is coupled to the contact plug and has the same width as the contact plug. When forming a bit line of a cell region, a barrier metal layer is formed between a bit line contact plug and a bit line conductive layer, such that interfacial resistance is reduced, a thickness of the bit line conductive layer is increased, conductivity is improved, and the height of overall bit line is reduced, resulting in reduction in parasitic capacitance.

20 Claims, 5 Drawing Sheets

SEMICONDUCTOR DEVICE AND METHOD FOR MANUFACTURING THE SAME

CROSS-REFERENCE TO RELATED APPLICATION

The present application is a divisional of U.S. patent application Ser. No. 13/607,628 filed on Sep. 7, 2012, which claims priority to Korean patent application No. 10-2012-0033281 filed on 30 Mar. 2012, the disclosures of which are incorporated by reference in their entireties.

BACKGROUND OF THE INVENTION

Embodiments of the present invention relate to a semiconductor device and a method for forming the same, and more particularly to a semiconductor device, and a method for manufacturing the same, in which a barrier metal layer is formed between a bit line contact plug and a bit line conductive layer when a bit line of a cell region is formed, such that interfacial resistance is reduced, a thickness of the bit line conductive layer is increased, conductivity is improved, and the height of the overall bit line is reduced, resulting in a reduction of parasitic capacitance.

A dynamic random access memory (DRAM) device includes a plurality of unit cells each having capacitors and transistors. The capacitor is used to temporarily store data, and the transistor is used to transfer data between a bit line and the capacitor in response to a control signal (word line). The data transfer occurs by using the semiconductor property that an electrical conductivity changes depending on the environment. The transistor has three regions, i.e., a gate, a source, and a drain. Electric charges move between the source and the drain according to a control signal input to the gate of the transistor. The movement of the electric charges between the source and the drain is achieved through a channel region. The semiconductor property is used in the channel.

In a typical method for manufacturing a transistor, a gate is formed in a semiconductor substrate, and a source and a drain are formed by doping impurities at both sides of the gate. In this case, a channel region of the transistor is defined between the source and the drain under the gate. The transistor having a horizontal channel region occupies a predetermined area of the semiconductor substrate. Therefore, the total number of unit cells per a wafer may depend on the size of the transistor.

If a unit cell size is reduce (or the size of each transistor is reduced), the number of semiconductor memory devices per wafer is increased, thereby improving productivity. Several methods for reducing the unit cell size have been proposed. One method is to replace a conventional planar gate having a horizontal channel region with a recess gate in which the recess is formed in a substrate and a channel region is formed along a curved surface of the recess by forming a gate in the recess. In addition, a buried gate has been studied, which can reduce a parasitic capacitance of a bit line by burying the entire gate within a recess.

In the conventional art, if a bit line conductive layer in a cell region is formed to be short (or shallow), resistance of the bit line conductive layer deteriorates. On the other hand, if the bit line conductive layer in the cell region is formed to be tall (or thick), parasitic capacitance between the bit line conductive layer and its neighboring storage node contact becomes severe, and the tall bit line conductive layer is prone to collapse. Furthermore, since a bit line of the cell region and a gate electrode of the peripheral circuit are simultaneously formed, a change in height of the bit line within the cell region affects the height of the gate electrode in the peripheral region. Accordingly, a shadowing effect occurs in a tilt implantation process of the peripheral region and thus makes it difficult or complicated to form a bit line and a peripheral gate at the same time in the cell region and in the peripheral region, respectively, in a subsequent process.

BRIEF SUMMARY OF THE INVENTION

Various embodiments of the present invention are directed to providing a semiconductor device and a method for manufacturing the same that substantially obviate one or more problems due to limitations and disadvantages of the related art.

An embodiment of the present invention provides a semiconductor device in which a barrier metal layer is formed between a bit line contact plug and a bit line conductive layer when a bit line of a cell region is formed, such that interfacial resistance is reduced, a thickness of the bit line conductive layer is increased, conti-resistance is reduced, and the height of overall bit line is reduced, resulting in reduction in parasitic capacitance, and also provides a method for manufacturing the same.

In accordance with an aspect of the present invention, a semiconductor device may include a contact hole formed over a semiconductor substrate, the contact hole opening an active region; a contact plug coupled to the active region, provided in the contact hole, and having a height smaller than that of the contact hole; and a bit line coupled to the contact plug and having substantially the same width as that of the contact plug.

The contact plug may include a polysilicon layer.

The bit line is formed of a laminated structure including a bit line conductive layer and a bit line hard mask layer.

The bit line conductive layer may include tungsten.

The bit line hard mask layer may include a nitride film.

The width of the contact plug and the bit line may be smaller than a width of the contact hole.

The device further may comprise a spacer material buried in the contact hole and formed at sidewalls of the contact plug and the bit line.

In accordance with another aspect of the present invention, a method for manufacturing a semiconductor device may include forming a contact hole opening an active region over a semiconductor substrate; forming a plug material in a lower portion of the contact hole; forming a first bit-line conductive material burying the contact hole over the plug material; forming a second bit-line conductive material over an entire surface including the first bit-line conductive material; forming a mask pattern over the second bit-line conductive layer; and etching the second bit-line conductive layer, the first bit-line conductive layer, and the plug material using the mask pattern as an etch mask, thereby forming a bit line contact plug and a bit line.

The formation of the plug material at the bottom of the contact hole may include forming a polysilicon layer over the entire surface including the contact hole; and performing an etch-back process in such a manner that the polysilicon layer remains only in the lower portion of the contact hole.

The method may further include forming a barrier metal layer over the plug material.

The first bit-line conductive layer may include tungsten.

The method may further include: after forming the first bit-line conductive layer, forming a gate conductive layer and a barrier metal layer over the entire surface including the first bit-line conductive layer; forming a mask pattern opening a cell region over the barrier metal layer; removing the barrier metal layer and the gate conductive layer from the cell region using the mask pattern as an etch mask; and removing the mask pattern.

The gate conductive layer may include a polysilicon layer, and the barrier metal layer includes tungsten silicide.

The second bit-line conductive layer is formed of substantially the same material as the first bit-line conductive layer.

The second bit-line conductive layer may include tungsten.

The mask pattern for use in the formation of the mask pattern may include a nitride film.

The formation of the bit line contact plug and the bit line may include widths of the bit line contact plug and the bit line are smaller than that of the contact hole, so that a sidewall of the contact hole is exposed.

After the formation of the bit line contact plug and the bit line, may deposit a spacer material over the entire surface including the bit line contact plug and the bit line, wherein the spacer material fills a space between the exposed sidewall of the contact hole and the bit line contact plug.

The spacer material may include a nitride film.

In accordance with other aspect of the present invention, a semiconductor device may include a bit line contact hole extended from a first level to a second level; a bit line contact plug having a top surface at a third level provided between the first level and the second level; and a first bit line conductive layer having a top surface at a second level.

The first level may be lower than the second level, the first level may be lower than third level, the third level may be lower than the second level.

A second bit line conductive layer may be coupled to the first bit line conductive layer, wherein the second bit line conductive layer having a top surface at fourth level higher than the second level.

In accordance with another aspect of the present invention, a method for manufacturing a semiconductor device may include forming a bit line contact hole to expose a substrate in a cell region from a first level to a second level; forming a bit line contact plug having a top surface at a third level provided between the first level and the second level in the bit line contact hole; and forming a first bit line conductive layer having a top surface at a second level over the bit line contact plug.

The first level is lower than the second level, the first level is lower than third level, the third level is lower than the second level.

The step of forming the bit line contact plug comprises: filling the bit line contact hole with a conductive material; and performing an etch-back process on the conductive material.

The method may further include forming a second bit line conductive layer coupled to the first bit line conductive layer.

The first bit line conductive layer fills the bit line contact hole.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
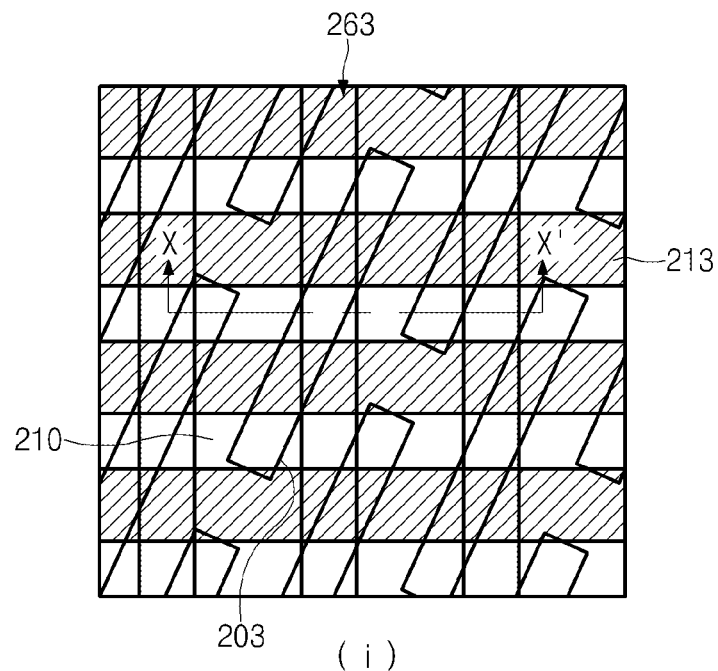
FIG. 1(i) is a plan view illustrating a semiconductor device according to an embodiment of the present invention, and FIG. 1(ii) is a cross-sectional view of the semiconductor device of FIG. 1(i), taken along the line X-X'.
Figure 1:
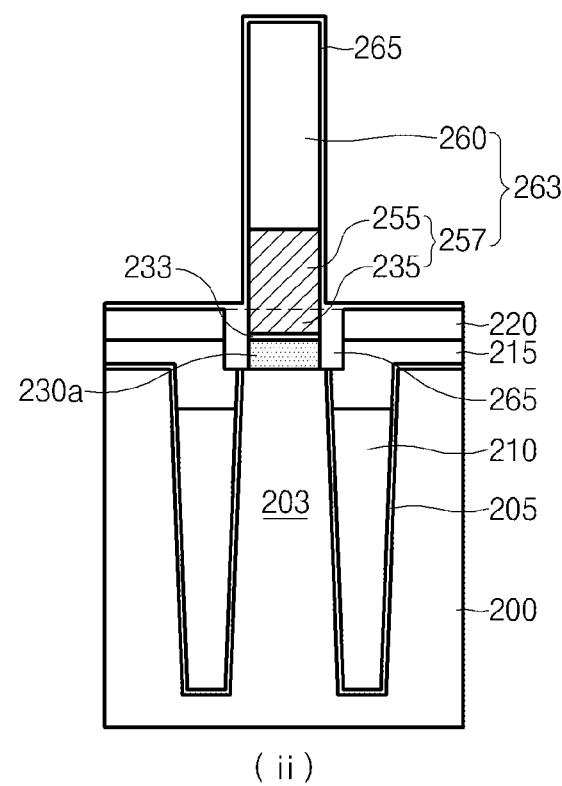

FIG. 1 illustrates a semiconductor device according to an embodiment of the present invention. FIG. 1(i) is a plan view illustrating the semiconductor device, and FIG. 1(ii) is a cross-sectional view illustrating the semiconductor device taken along the line X-X' of FIG. 1(i).

Referring to FIG. 1, an active region 203 and a device isolation film 210 are formed in a semiconductor substrate 200. In an embodiment, the active region 203 may be angled with respect to a gate line 213. In addition, a sidewall oxide film 205 may further be formed between the active region 203 and a device isolation film 210.

Two gate lines 213 are formed to pass through a single active region 203, and a bit line contact plug 230a, coupled to the active region 203 located between two gate lines 213, is formed over the substrate 200 in the single active region 203. In addition, a bit line 263 coupled to the bit line contact plug 230a extends in a direction perpendicular to the gate lines 213. In an embodiment, the bit line contact plug 230a is formed at the bottom of a bit line contact hole (225 of FIG. 2A), and a width of the bit line contact plug 230a is smaller than that of the bit line contact hole 225. The bit line contact plug 230a is formed of polysilicon.

The bit line 263 is formed in an active region 203 in such a manner that one bit line 263 crosses over the active region 203. The bit line 263, formed over the bit line contact plug 230a, is formed of a laminated structure including a bit line conductive layer 257 and a bit line hard mask 260. An interface between the bit line contact plug 230a and the bit line conductive layer 257 may further include a barrier metal layer 233. The barrier metal layer 233 may be formed of a titanium silicide film, and reduces interfacial resistance between the polysilicon layer 230 and the bit line conductive layer 257. The bit line conductive layer 257 includes tungsten, and the bit line hard mask 260 includes a nitride film. A spacer layer 265 is formed over the entire surface including the bit line 263. The spacer layer 265 fills a gap that is formed in the bit line contact hole 225 after the bit line contact plug 230a is formed.

In the above-described semiconductor device, the bit line contact plug 230a is formed only at the bottom of the bit line contact hole 225, such that the bit line conductive layer 257 can be formed to have a large thickness, and thus, to have good conductivity characteristics. The above-mentioned operations may be carried out at the same time that a gate electrode of a peripheral region is formed. A gate barrier metal layer in the cell region, which is formed when a gate barrier metal layer in the peripheral region is formed, can be removed, thus a height of bit line conductive layer 257 can be increased. Since the distance from the surface of the substrate 200 to a top surface of the bit line conductive layer 257 is not increased, parasitic capacitance between the bit line conductive layer 257 and a storage node contact (not shown) does not increase either.

FIGS. 2A to 2G are cross-sectional views illustrating a method for manufacturing a semiconductor device according to an embodiment of the present invention. FIGS. 2A to 2G are cross-sectional views illustrating a method of manufacturing the semiconductor of FIG. 1(i).

Figure 2A:
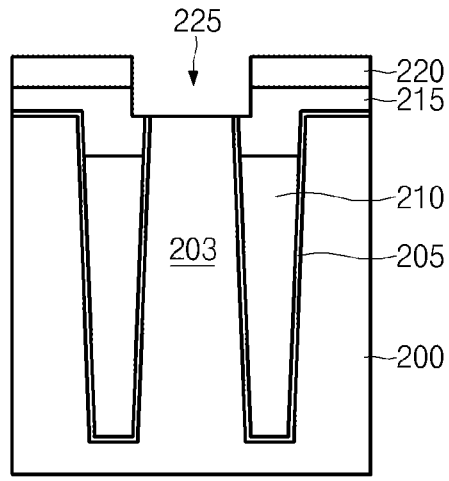
FIGS. 2A to 2G are cross-sectional views illustrating a method for manufacturing a semiconductor device according to an embodiment of the present invention.

Referring to FIG. 2A, a device isolation trench defining the active region 203 is formed by etching the semiconductor substrate 200. After a sidewall oxide film 205 is formed over an inner sidewall of the device isolation trench, an insulation film for device isolation is buried so that a device isolation film 210 is formed. Subsequently, a buried gate is formed (not shown). Because FIGS. 2A to 2G are cross-sectional views taken along a particular cross section of a semiconductor device in order to show a method of manufacturing the device according to an embodiment of the present invention, FIGS. 2A to 2G do not show a buried gate. However, a method for forming the buried gate will hereinafter be described with reference to the attached drawings. After forming a mask pattern 215 defining the buried gate, the active region 203 is etched using the mask pattern 215 as an etch mask, resulting in the formation of a recess. A gate conductive material is buried in the bottom of the recess, so that the buried gate is formed. A sealing film 220 for isolating each buried gate is formed over the entire surface including the buried gate. Preferably, the sealing film 220 may be formed of a nitride film.

Subsequently, using a mask (not shown) defining a bit line contact region, the mask pattern 215 and the sealing film 220 are etched so that a bit line contact hole 225 is formed. Preferably, a process for etching the bit line contact hole 225 may be performed until the active region 203 is exposed.

Figure 2B:
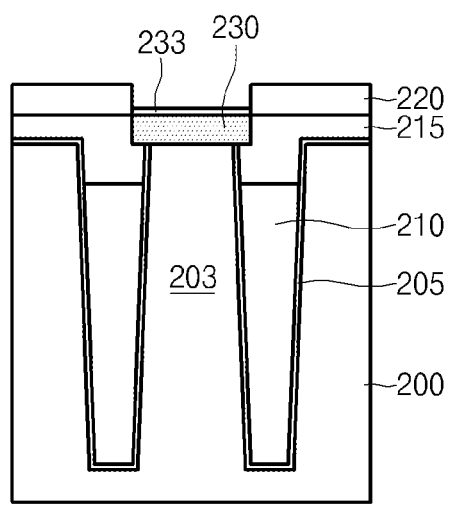

Referring to FIG. 2B, a polysilicon layer 230 is formed over the entire surface including the bit line contact hole 225, and is then etched back, such that the polysilicon layer 230 remains only at the bottom of the bit line contact hole 225. A barrier metal layer 233 is formed over the polysilicon layer 230. In order to form the barrier metal layer 233, a titanium (Ti) film may be formed over the polysilicon film 230, and rapid thermal annealing may be carried out on the resultant structure. The barrier metal layer 233 formed through the above-mentioned process may be a titanium silicide film. Preferably, the barrier metal layer 233 may be formed to reduce interfacial resistance between the polysilicon layer 230 and a bit line conductive layer to be formed in a subsequent process.

Figure 2C:
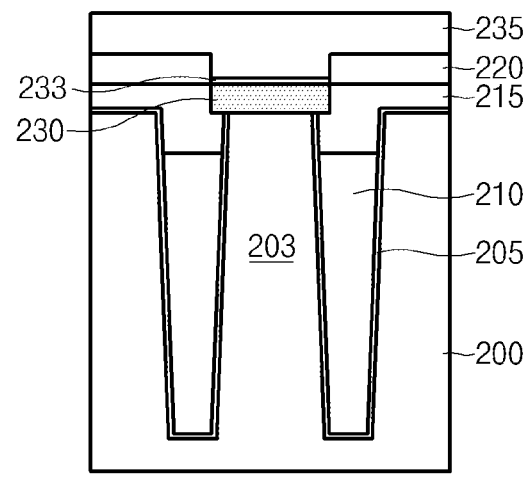

Referring to FIG. 2C, a first bit-line conductive layer 235 is formed over the entire surface of the semiconductor substrate 200 including the bit line contact hole 225 in which the polysilicon layer 230 is formed. Preferably, the first bit-line conductive layer 235 may be formed of tungsten. Thereafter, a planarization process is performed until the sealing film 220 is exposed, such that the polysilicon 230 and the first bit-line conductive layer 235 remain in the bit line contact hole 225.

Figure 2D:
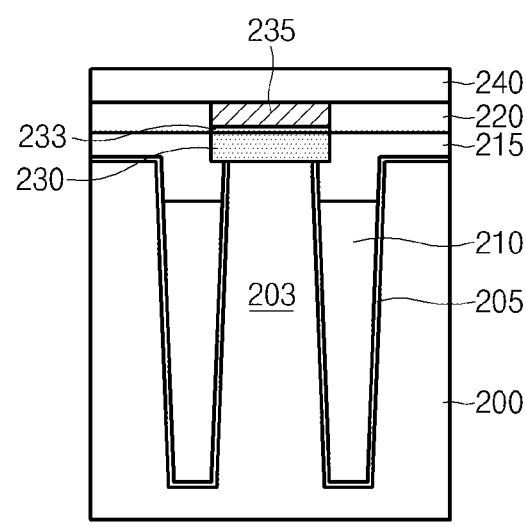

Referring to FIG. 2D, a capping film 240 is formed over the entire surface of the semiconductor substrate 200 including the first bit-line conductive layer 235. The capping film 240 may be formed of a nitride film.

Figure 2E:
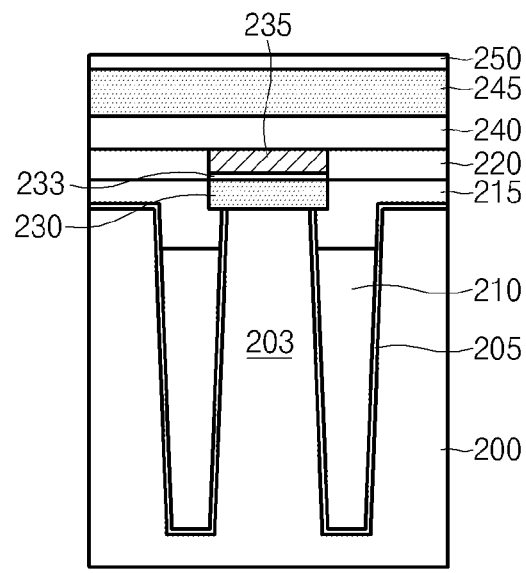

Referring to FIG. 2E, a gate conductive layer 245 and a gate barrier metal layer 250 are formed over the capping film 240. The gate conductive layer 245 and the gate barrier metal layer 250 are adapted to form a gate electrode in the peripheral region, and may be formed simultaneously in the cell region and the peripheral region. The gate conductive layer 245 may include polysilicon, and the gate barrier metal layer 250 may include tungsten silicide.

A mask pattern (not shown) configured to open the cell region is formed over the gate barrier metal layer 250. In addition, the gate barrier metal layer 250 and the gate conductive layer 245 are removed from the cell region exposed by the above-mentioned mask pattern (not shown). The gate barrier metal layer 250 is used to form the gate electrode in the peripheral region, and need not be present in the cell region. As a result, the gate conductive layer 245 of the cell region is removed and at the same time the barrier metal layer 250 is also removed. Thereafter, the capping film 240 is removed. In an embodiment, the process for removing the gate barrier metal layer 250 from the cell region does not affect a tilt implantation process, which is performed after the gate electrode of the peripheral region is formed.

Figure 2F:
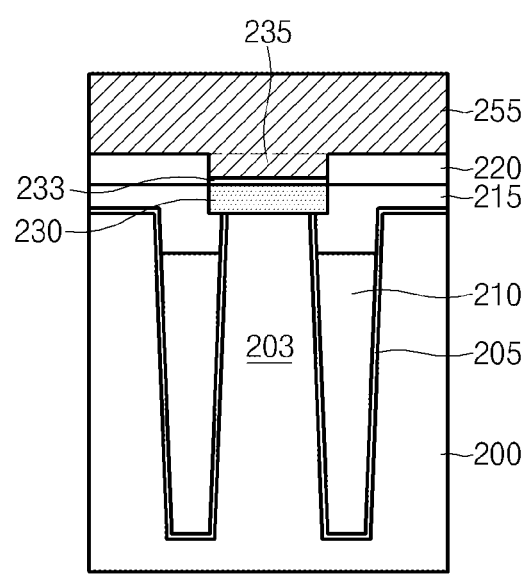

Referring to FIG. 2F, a second bit-line conductive layer 255 is formed over the entire surface of the semiconductor substrate 200 including the first bit-line conductive layer 235. The second bit-line conductive layer 255 is also used as a gate metal layer in the peripheral region, and may be formed of a material including tungsten. The first bit-line conductive layer 235 and the second bit-line conductive layer 255, which is formed in an upper part of the bit line contact hole 225, may be formed of the same material. The barrier metal layer 250 is removed as shown in FIG. 2E, such that there is no barrier material between the first bit-line conductive layer 235 and the second bit-line conductive layer 255.

Figure 2G:
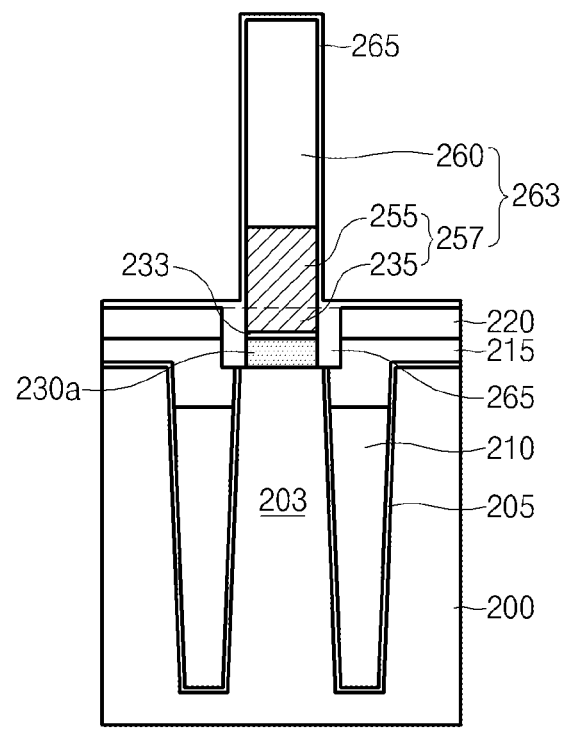

Referring to FIG. 2G, a bit line hard mask pattern 260 is formed over the second bit-line conductive layer 255. The second bit-line conductive layer 255, the first bit-line conductive layer 235, and the polysilicon layer 230 are etched using a bit line hard mask pattern 260 as an etch mask, such that a bit line contact plug 230a and a bit line 263 are formed. In an embodiment, a width of the bit line contact plug 230a that is etched simultaneously with the bit line 263 is smaller than that of the bit line contact hole 225. That is, the bit line contact hole 225 is partially exposed at a sidewall of the bit line contact plug 230a. The bit line 263 is formed in the cell region, and at the same time a gate electrode is formed in the peripheral region.

Subsequently, a spacer layer 265 is deposited over the entire surface including the bit line contact plug 230a and the bit line 263. Preferably, the spacer layer 265 may be formed of a nitride film, and may be formed in such a manner that the bit line contact hole 225, exposed at a lateral surface of the bit line contact plug 230a, is completely filled.

As is apparent from the above description, in a semiconductor device and a method for manufacturing the same according to an embodiment of the present invention, the bit line contact plug 230a is formed only at the bottom of the bit line contact hole 225, and a tungsten layer acting as a bit line conductive layer is formed in the bit line contact hole, such that the height of bit line conductive layer is effectively increased. As a result, conductivity can be improved.

Since the barrier metal layer, which is unnecessarily formed in the cell region, is removed, a distance from a surface of the substrate 200 to a top surface of the bit line second conductive layer 255 is maintained and the overall thickness of the bit line conductive layer 257 is increased. Parasitic capacitance between a storage node contact plug and the bit line conductive layer 257 can be reduced.

The above embodiments of the present invention are illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A semiconductor device comprising:
   a contact hole formed over a semiconductor substrate, the contact hole opening an active region;
   a contact plug coupled to the active region, provided in the contact hole, and having a height smaller than that of the contact hole; and
   a bit line coupled to the contact plug and having substantially the same width as that of the contact plug,
   wherein a first width of an upper portion of the bit line and a second width of a lower portion of the bit line are substantially the same, and
   wherein the entire bit line and the entire contact plug have the same width.

2. The semiconductor device according to claim 1, wherein the contact plug includes a polysilicon layer.

3. The semiconductor device according to claim 1, wherein the bit line is formed of a laminated structure including a bit line conductive layer and a bit line hard mask layer.

4. The semiconductor device according to claim 3, wherein the bit line conductive layer includes tungsten.

5. The semiconductor device according to claim 3, wherein the bit line hard mask layer includes a nitride film.

6. The semiconductor device according to claim 1, wherein the width of the contact plug and the bit line are smaller than a width of the contact hole.

7. The semiconductor device according to claim 1, the device further comprising: a spacer material buried in the contact hole and formed at sidewalls of the contact plug and the bit line.

8. The semiconductor device of claim 7, wherein the spacer material includes a nitride film.

9. The semiconductor device of claim 1, the device further comprising: a barrier metal layer disposed over the contact plug.

10. The semiconductor device of claim 9, wherein the barrier metal layer includes a tungsten silicide.

11. The semiconductor device of claim 1, the device further comprising: a barrier metal layer disposed between the bit line and the contact plug.

12. The semiconductor device of claim 1, wherein the upper portion of the bit line includes a bit line hard mask layer, and the upper portion of the bit line has a bottom surface that is substantially coplanar with a top surface of the contact hole, and
   wherein the lower portion of the bit line has a top surface that is substantially coplanar with the top surface of the contact hole.

13. The semiconductor device of claim 1, wherein the width of the bit line is substantially uniform in a direction perpendicular to a bottom surface of the contact hole.

14. The semiconductor device of claim 1, wherein the bit line and the contact plug has a uniform profile in a direction perpendicular to a top surface of the contact plug.

15. A semiconductor device comprising:
   a bit line contact hole extending from a first level to a second level;
   a bit line contact plug having a top surface at a third level provided between the first level and the second level;
   a first bit line conductive layer having a top surface at the second level; and
   a second bit line conductive layer coupled to the first bit line conductive layer, the second bit line conductive layer having a top surface at a fourth level higher than the second level,
   wherein a first width of the first bit line conductive layer and a second width of the second bit line conductive layer are substantially the same, and
   wherein the first width of the first bit line conductive layer is uniform in a direction perpendicular to a top surface of the bit line contact plug and the second width of the second bit line conductive layer is uniform in the direction.

16. The semiconductor device of claim 15, wherein the first level is lower than the second level, the first level is lower than third level, the third level is lower than the second level.

17. The semiconductor device of claim 15, the device further comprising: a barrier metal layer disposed over the bit line contact plug.

18. The semiconductor device of claim 15, the device further comprising: a barrier metal layer disposed between the first bit line conductive layer and the bit line contact plug.

19. The semiconductor device of claim 15, wherein the second bit line conductive layer has the same material as the first bit line conductive layer.

20. The semiconductor device of claim 15, wherein the first bit line conductive layer includes tungsten.

* * * * *